(12) United States Patent
Yang et al.

(10) Patent No.: US 11,009,542 B2
(45) Date of Patent: May 18, 2021

(54) THYRISTOR VALVE TEST SYSTEM BASED ON COOPERATION OF LOGICAL FUNCTIONS OF SOFTWARE

(71) Applicants: NR ELECTRIC CO., LTD, Jiangsu (CN); NR ENGINEERING CO., LTD, Jiangsu (CN)

(72) Inventors: Fan Yang, Jiangsu (CN); Lei Liu, Jiangsu (CN); Xiang Zhang, Jiangsu (CN); Chen Zhou, Jiangsu (CN); Weiming Pan, Jiangsu (CN); Taixun Fang, Jiangsu (CN)

(73) Assignees: NR ELECTRIC CO., LTD, Jiangsu (CN); NR ENGINEERING CO., LTD, Jiangsu (CN)

( * ) Notice: Subject to any disclaimer, the term of this patent is extended or adjusted under 35 U.S.C. 154(b) by 12 days.

(21) Appl. No.: 16/496,384

(22) PCT Filed: Jun. 20, 2018

(86) PCT No.: PCT/CN2018/091974
§ 371 (c)(1),
(2) Date: Sep. 20, 2019

(87) PCT Pub. No.: WO2019/011113
PCT Pub. Date: Jan. 17, 2019

(65) Prior Publication Data
US 2020/0011923 A1    Jan. 9, 2020

(30) Foreign Application Priority Data

Jul. 10, 2017    (CN) .......................... 201710555210.0

(51) Int. Cl.
*G01R 31/26*    (2020.01)
*G01R 31/333*    (2006.01)

(52) U.S. Cl.
CPC ....... *G01R 31/263* (2013.01); *G01R 31/3336* (2013.01)

(58) Field of Classification Search
None
See application file for complete search history.

(56) References Cited

U.S. PATENT DOCUMENTS 5,521,526 A * 5/1996 Nyberg ................ G01R 31/263
324/762.01
6,211,792 B1 * 4/2001 Jadric .................. H02H 7/0844
318/800
(Continued)

FOREIGN PATENT DOCUMENTS

CN         201130234 Y     10/2008
CN         102035189 A1     4/2011
(Continued)

OTHER PUBLICATIONS

Japanese Office Action dated Mar. 17, 2020, issued in Japanese Application No. 2019-543908, total 5 pages.
(Continued)

*Primary Examiner* — Jermele M Hollington
(74) *Attorney, Agent, or Firm* — Masuvalley & Partners

(57) ABSTRACT

A thyristor valve test system based on cooperation of logic functions of software, wherein the test system comprises: a thyristor valve (5) to be tested, a VBE (3) and a tester (4), and the VBE (3) has a dedicated test mode, the tester (4) provides three steps for each test item. The thyristor valve (5) to be tested and the VBE (3) are connected by optical fibers (1), and the thyristor valve (5) to be tested and the tester (4) are connected by cables (2), and there is no connection between the VBE (3) and the tester (4).

2 Claims, 4 Drawing Sheets

(56) References Cited

U.S. PATENT DOCUMENTS

| | | | | |
|---|---|---|---|---|
| 6,791,852 B2* | 9/2004 | Carter | ................. | H02H 7/1255 |
| | | | | 361/100 |
| 9,746,513 B2* | 8/2017 | Geske | ................. | G01R 31/263 |
| 2012/0194957 A1* | 8/2012 | Wei | ....................... | H02M 1/32 |
| | | | | 361/91.8 |
| 2018/0196099 A1* | 7/2018 | Gao | ...................... | H02J 13/00 |
| 2018/0218965 A1* | 8/2018 | Zhang | ................. | H01L 23/367 |

FOREIGN PATENT DOCUMENTS

| | | | | |
|---|---|---|---|---|
| CN | 103219798 A | 7/2013 | | |
| CN | 103713250 A | 4/2014 | | |
| CN | 104038034 A | 9/2014 | | |
| EP | 3316293 A1 * | 5/2018 | ............ | H01L 25/117 |
| JP | 1990276419 A | 11/1990 | | |
| JP | 2003204807 A | 10/2003 | | |
| KR | 10-2015-0017256 A | 2/2015 | | |
| KR | 20150017256 A * | 2/2015 | ......... | G01R 31/3183 |

OTHER PUBLICATIONS

ISA/CN, International Search Report dated Oct. 25, 2018 in International Application No. PCT/CN/2018/091974, Total 4 pages with English translation.

* cited by examiner

THYRISTOR VALVE TEST SYSTEM BASED ON COOPERATION OF LOGICAL FUNCTIONS OF SOFTWARE

This application is the U.S. National Phase of and claims priority to International Patent Application No. PCT/CN2018/091974, International Filing Date Jun. 20, 2018; which claims benefit of Chinese Patent Application No. 201710555210.0 filed Jul. 10, 2017; both of which are incorporated herein by reference in their entireties.

TECHNICAL FIELD

The present invention relates to a test system and a corresponding test method for functional testing of a thyristor valve at engineering sites and belongs to the field of power electronics.

BACKGROUND

The trigger system of Ultra-high-voltage DC transmission generally includes a control protection system (PCP), a valve-based electronic device (VBE) and a thyristor control unit (TCU), wherein the control protection system is responsible for generating a control pulse (CP) to send to the VBE, and the VBE is a bridge between the PCP and the TCU, which is responsible for converting the CP into an firing pulse (FP) under certain conditions and sending the FP to the TCU. The TCU is a device for monitoring, control, and protection at the converter valve tower. The monitoring function of TCU mainly includes: when the voltage of thyristor is greater than a certain threshold value, the TCU sends a indication pulse (IP) with a pulse width 1 to the VBE; when the thyristor level has a protective firing, the TCU sends a IP with a pulse width 2 to the VBE. The control function mainly refers to that when the TCU receives the FP, it sends a firing signal to the gate of thyristor to turn on the thyristor. The protection function mainly includes: when the thyristor level is in a reverse recovery period and suddenly applied with a forward voltage of amplitude 1, the TCU sends a firing signal to the gate of thyristor to turn on the thyristor; at any time when the thyristor level is applied with a voltage of amplitude 2, the TCU sends a trigger signal to the thyristor gate level to turn on the thyristor.

These monitoring, control and protection functions based on TCU have a significant impact on the operation of the converter valve. At the engineering site where the thyristor valve is applied, it is necessary to perform special functional tests on the thyristor valve before putting it into use, after annual inspection or equipment failure. The control and protection functions of the TCU can be verified by the electrical signals at the thyristor level. The monitoring function of the TCU needs to be verified by the optical signal it returns. When testing at the engineering site, the fiber laying and all the connections between TCUs and VBEs have been completed. Therefore, for the tests in the past, the fibers connected to the TCU and the VBE are generally pulled out, and then the TCU and the tester are connected with another fiber, as shown in FIG. 1, so that the optical signal can be directly transmitted between the TCU and the tester to meet the needs of the test. However, there is a big risk in such approach, that is, when testing each thyristor level, at least two fiber insertions and removals on the TCU are required. If the testing for thyristor levels is not successful, the optical fiber may be inserted and removed multiple times during the inspection process, and each insertion and removal of the optical fiber may cause contamination and wear on the optical interface of the optical fiber and the TCU, affecting the transmission of the optical signal. In the past, at engineering sites, there have been cases where after completing the functional test on the thyristor valve by the tester and recovering the original fiber, an optical path failure was found in subsequent tests. Since all the optical paths will be tested uniformly after the completion of the fiber laying in the early stage, it indicates that the optical path failure is caused by repeated insertion and removal during the test of the thyristor valve by the tester, and the workload of the optical path test is huge, and it is impossible to perform a retest, so the damaged fiber path will be left out into the subsequent test process, causing impact.

SUMMARY

The problem to be solved by the present invention is that, in view of the shortcomings of the above test system and test method, the present invention provides a solution that without insertion and removal of the connected optical fibers between VBEs and TCUs, all test functions and test requirements of the thyristor valve can be satisfied by mutual cooperation between the tester and the VBE.

The invention provides a test system for a thyristor valve, the test system comprising: a tested thyristor valve, a tester and a VBE.

Wherein the tested thyristor valve comprises at least one thyristor level, each thyristor level at least comprises a thyristor, a TCU and an auxiliary circuit as required.

Wherein, the VBE has a dedicated test mode:

1. sending a FP to the TCU every time the valve control unit receives N consecutive IP 1;
2. after receiving the IP 2, the valve control unit does not send the FP to the TCU when the next N consecutive IP 1 are received;
3. if the valve control unit does not receive any IP within a certain time T, calculate the number of all IP from zero.

Wherein, each test item of the tester is divided into three steps:

1. applying a sinusoidal voltage, wherein the tester detects whether the thyristor is turned on during this stage, and determines whether the entire thyristor level circuit and optical paths work normally;
2. applying a sinusoidal voltage or a surge voltage or the combination of a sinusoidal voltage and a surge voltage corresponding to the content of the test project, wherein the tester detects the thyristor voltage and current in this stage, and determines whether the thyristor valve in the test project satisfies the electrical requirements;
3. applying a sinusoidal voltage, wherein the tester detects whether the thyristor is turned on in this stage, and determines whether the optical signal sent by the thyristor valve to the VBE in step 2 is correct.

Wherein, the tested thyristor valve and the VBE are connected by fibers, the tested thyristor valve and the tester are connected by cables, and there is no connection between the VBE and the tester.

Compared with the existing test systems and test methods, the technical solution provided by the present invention does not need someone to insert and remove each fiber in the field test, and only needs to set the VBE to the test mode, and utilizes the existing fibers between VBE and TCU, and connects the tester to the tested thyristor valve one by one. During the test, each item is divided into 3 steps, which can detect the IP of the optical path, circuit and TCU, and achieve the test without increasing the field test equipment and test workload, and complete the test in a comprehensive and reliable manner at the same time. Especially for projects with a large number of thyristors, it is highly practical.

DESCRIPTION OF EMBODIMENTS

The present invention will be further explained and described below in conjunction with an embodiment, but the scope of protection of the present invention is not limited thereto.

Figure 1:
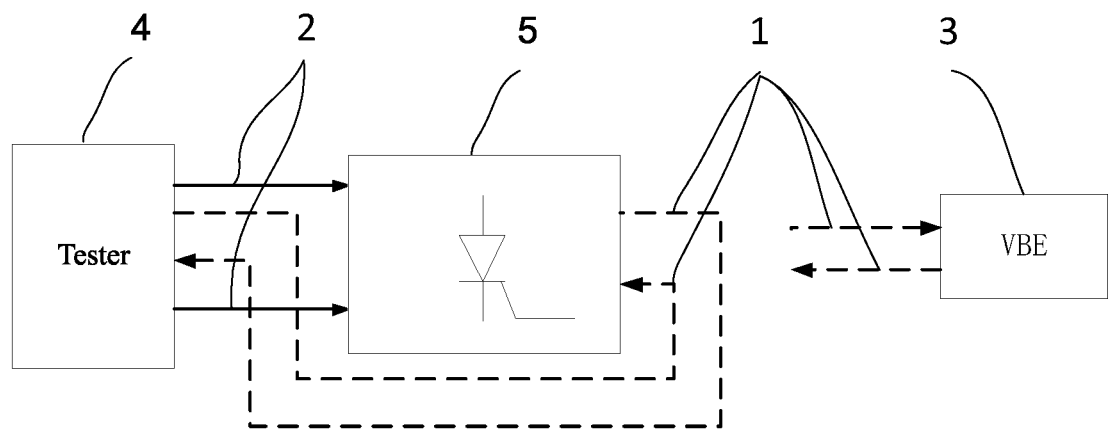
FIG. 1 is a schematic diagram of a conventional test system for a thyristor valve.
Figure 2:
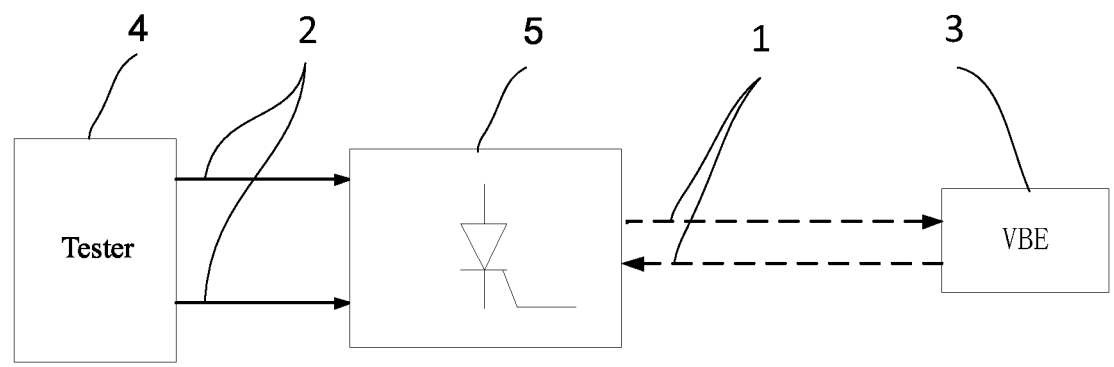
FIG. 2 is a schematic diagram of a thyristor test system according to the present invention.

The test system provided in the embodiment is shown in FIG. 2, and comprises a tester 4, a tested thyristor valve 5, and a VBE 3, wherein, the tested thyristor valve 5 and the VBE 3 are connected with each other via only two optical fibers which are used for transmitting FP and IP (one for reception and one for transmission); the tested thyristor valve 5 and the tester 4 are connected with each other via only two cables, which are used for the tester 4 to apply a test voltage to the tested thyristor valve 5; there is no connection between the tester 4 and the VBE 3.

Figure 3:
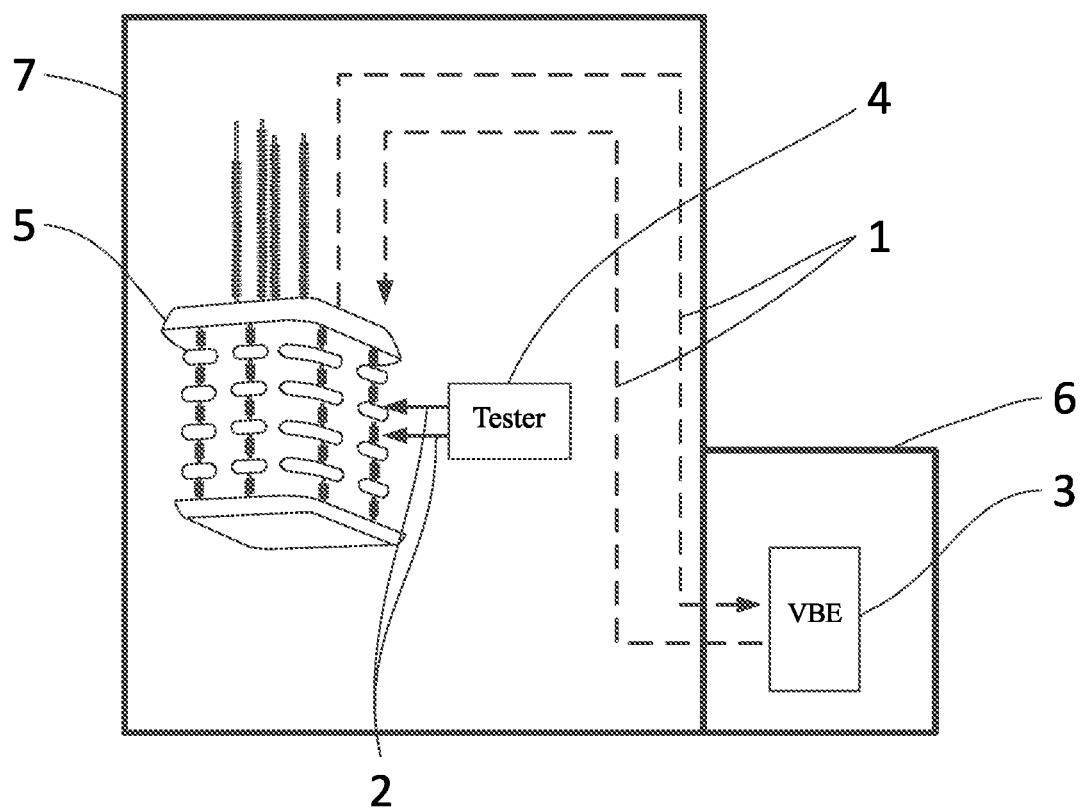
FIG. 3 is a spatial layout diagram of a thyristor test system according to the present invention.

The spatial layout of the test system provided in the embodiment is shown in FIG. 3. The tested thyristor valve 5 is connected to the VBE 3 located in the control room 6 through optical fiber 1. The tester 4 is located in a valve hall 7, and is close to the tested thyristor valve 5. The tester 4 is connected to the tested thyristor valve 5 via the cable 2.

Figure 4:
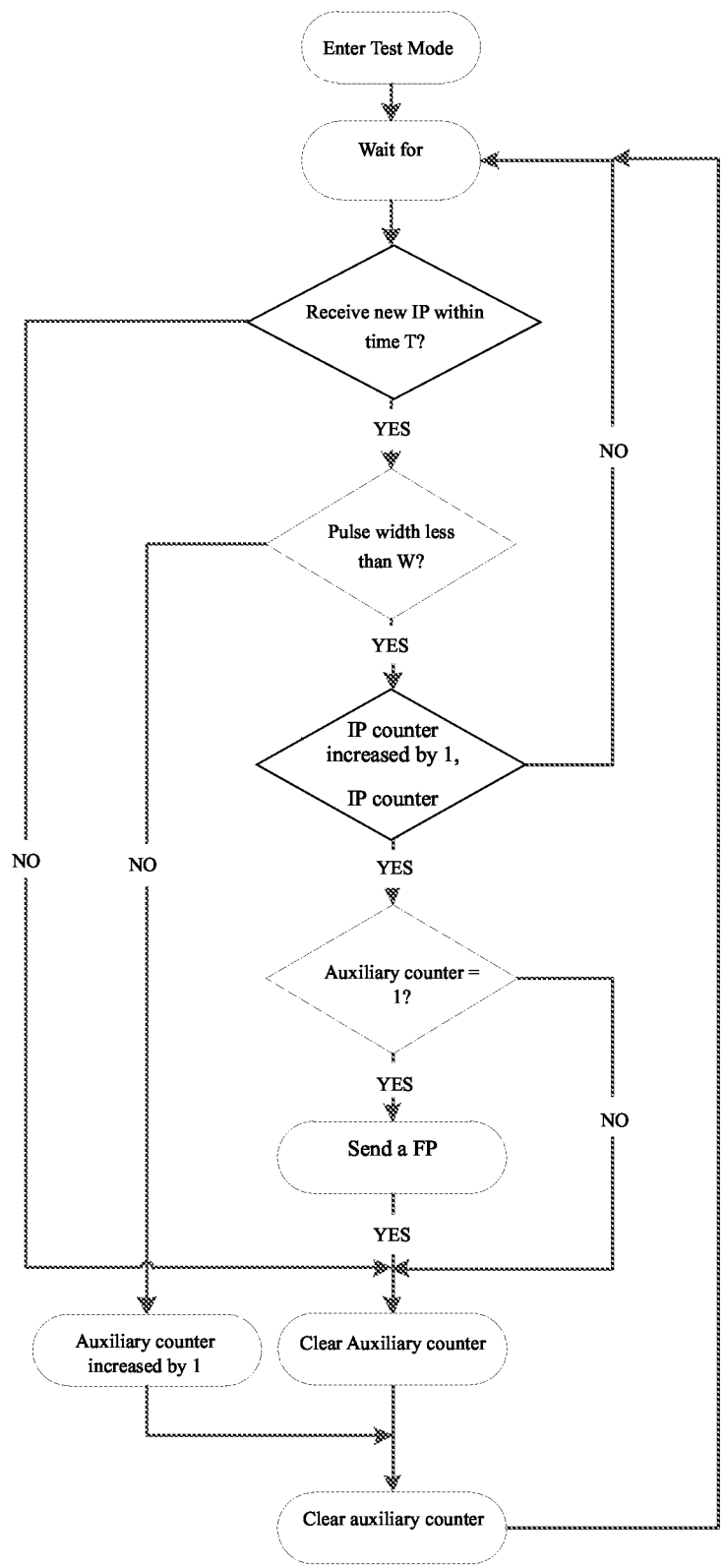
FIG. 4 is a logic flow chart of a test mode of a VBE according to the present invention.

By functional logic cooperation, the VBE 3 and the tester 4 in the embodiment can achieve the accuracy of the TCU IP signal without the need of fiber connection. The method is described specifically as follows:

In addition to the normal firing function, the VBE 3 has a dedicated test mode. A testing technician can switch the VBE 3 to the test mode by setting a control word or other method. In the test mode, the functional logic of the VBE 3 is shown in FIG. 4:

Each time when the VBE 3 receives a IP having a width of less than 15 µs, the return counter is incremented by 1. When the count value is 10, if the value of the auxiliary counter is 0, the VBE 3 sends a FP to the tested thyristor valve 5 and clears the counter. If the value of the auxiliary counter is 1, the VBE 3 does not send a firing FP, and directly clears all counters;

When the VBE 3 receives a IP having a width greater than 15 µs, the auxiliary counter is incremented by 1 and the return counter is cleared;

When the VBE 3 does not receive the IP within 2 s, all the counters are cleared.

Figure 5:
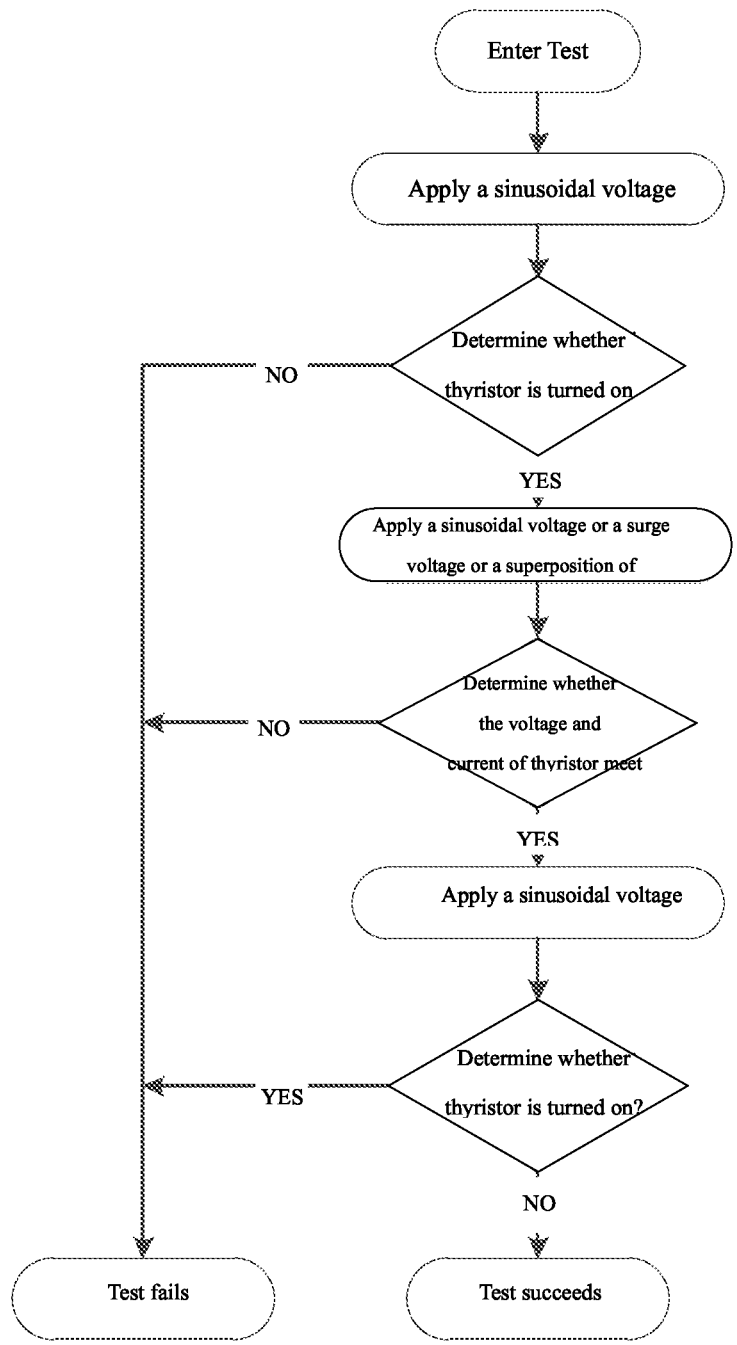
FIG. 5 is a step diagram of a test procedure of a tester according to the present invention.

The tester 4 applies voltage in each test item can be divided into three steps, as shown in FIG. 5:

In the first stage, the tester 4 applies a sinusoidal voltage of 15 cycles. In this stage, the VBE 3 sends a firing FP to the tested thyristor valve 5. If all circuits and optical paths are normal, tested thyristor valve 5 will be turned on, the tester 4 detects the thyristor current in this stage for determining whether the entire thyristor level circuit and optical paths work normally;

In the second stage, the tester 4 applies a sinusoidal voltage or a surge voltage or the combination of a sinusoidal voltage and a surge voltage corresponding to the content of the test project. This stage is the main stage of the test, in which the tester 4 detects the thyristor voltage and current, and determines whether the thyristor valve meets the test requirements of this test item in terms of electrical aspects;

In the third stage, the tester 4 applies a sinusoidal voltage of 15 cycles. In this stage, the VBE 3 determines whether to send a firing FP to the tested thyristor valve 5 according to whether the feedback signal received in the second stage is correct. In this stage, the tester detects whether the thyristor is turned on, and determines whether the optical signal returned to the VBE 3 by the tested thyristor valve 5 in the second stage is correct.

The invention is characterized in that all the tests and test requirements can be achieved by the cooperation in terms of logic function between the VBE and the tester, without inserting and removing the connected fibers in the field.

A person skilled in the art can make variations and modifications within the scope of the invention as long as it does not exceed the scope of the claims.

What is claimed is:
1. A thyristor valve test system based on cooperation of logic functions of software, wherein the test system comprises: a tested thyristor valve, a tester and a valve based electronics (VBE), wherein the tested thyristor valve and the VBE are connected via optical fibers, which are used for transmitting a firing pulse (FP) and an indication pulse (IP); the tested thyristor valve and the tester are connected via cables, which are used for the tester to apply a test voltage to the tested thyristor valve; there is no connection between the VBE and the tester; the tested thyristor valve includes at least one thyristor level, the thyristor level at least includes a thyristor, a thyristor control unit (TCU) and an auxiliary circuit; the TCU feeds back an IP1 to the VBE when in normal operation, and the value of a return counter is incremented by 1 each time the VBE receives an IP1; and the TCU feeds back an IP2 to the VBE when being protective fired, and the value of an auxiliary counter is incremented by 1 each time the VBE receives an IP2;
   VBE is provided with a test mode correspondingly, and in the test mode:
   a. send a FP to the tested thyristor valve and clear the return counter if the VBE receives N consecutive IP1 and the value of an auxiliary counter is 0;
   b. after receiving the IP2, the value of the auxiliary counter is incremented by 1, the VBE does not send FP to the tested thyristor valve when next time receiving N consecutive IP1;
   c. if the VBE does not receive any of the IPs within a certain time T, calculate the number of the IP1 and IP2 from zero by clearing the values of the return counter and the auxiliary counter to 0; and
   the tester applies different voltages in different stages according to the test requirements.
2. The thyristor valve test system based on cooperation of logic functions of software according to claim 1, wherein applying different voltages in different stages by the tester according to the test requirements specifically refers to that each test item comprises three steps:
   a. applying a sinusoidal voltage, wherein the tester detects whether the thyristor is turned on during this stage, and determines whether the entire thyristor level circuit and optical paths work normally;

b. applying a sinusoidal voltage or a surge voltage or the combination of a sinusoidal voltage and a surge voltage corresponding to the content of the test item, wherein the tester detects the thyristor voltage and current in this stage, and determines whether the thyristor valve in the test item satisfies the electrical requirements; and c. applying a sinusoidal voltage, wherein the tester detects whether the thyristor is turned on in this stage, and determines whether the optical signal sent by the thyristor valve to the VBE in step b is correct.

* * * * *